United States Patent [19]

Beasom

[11] 4,210,875

[45] Jul. 1, 1980

[54] INTEGRATED AMPLIFIER WITH ADJUSTABLE OFFSET VOLTAGE

[75] Inventor: James D. Beasom, Melbourne, Fla.

[73] Assignee: Harris Corporation, Melbourne, Fla.

[21] Appl. No.: 974,477

[22] Filed: Dec. 29, 1978

[51] Int. Cl.² ............................ H03F 3/45; B01J 17/00
[52] U.S. Cl. ................................. 330/261; 29/577 R;
29/586; 330/277; 330/307
[58] Field of Search ............... 330/261, 277, 300, 307;
29/581, 586, 577 R, 577 C, 628

[56] References Cited

U.S. PATENT DOCUMENTS

| | | | |
|---|---|---|---|
| 3,761,787 | 9/1973 | Davis et al. | 29/584 X |
| 3,930,304 | 1/1976 | Keller et al. | 29/574 |

*Primary Examiner*—James B. Mullins

*Attorney, Agent, or Firm*—Leitner, Palan, Lyman, Martin & Bernstein

[57] ABSTRACT

An operational amplifier including two parallel transistors in each of the two current paths with one of the transistors being connected to the current path by a fusible element and the other transistor being connected to the path by an impedance which does not affect the overall operation of the current path during normal operation with the current in the first direction and steers the current in the opposite direction towards the fusible element to blow the fusible element by forward biasing a normally reversed biased junction. Using bipolar transistors, the base-collector junction is forward biased to blow the fusible element. A single junction field effect transistor can be used having a plurality of parallel drain segments and the gate-drain junction is forward biased.

25 Claims, 6 Drawing Figures

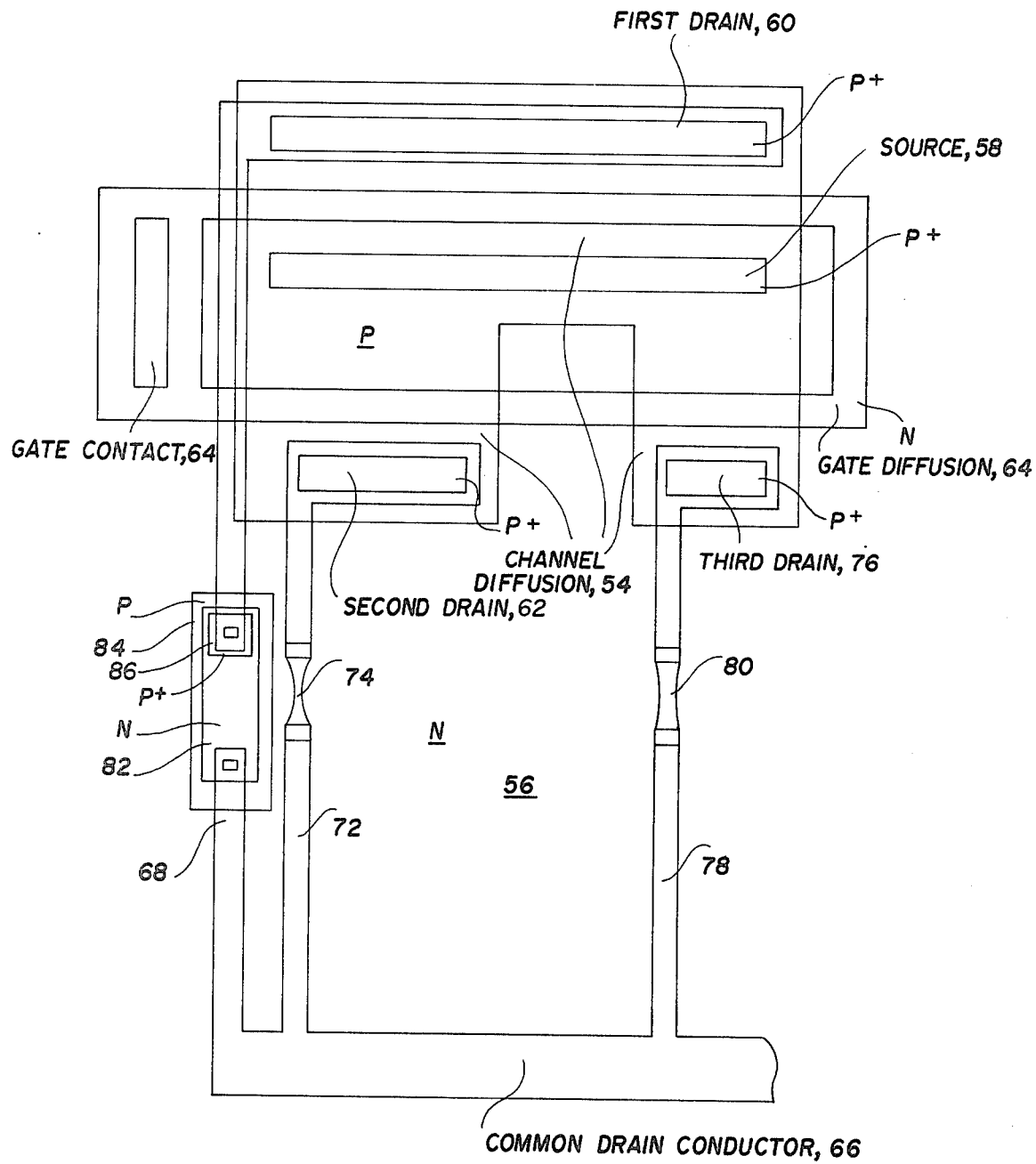

INTEGRATED AMPLIFIER WITH ADJUSTABLE OFFSET VOLTAGE

BACKGROUND OF THE INVENTION

1. Field of the Invention

The present invention relates generally to operational amplifiers, and more specifically to a method and structure for electrically altering the offset voltage of the operational amplifier.

2. Description of the Prior Art

Operational amplifiers are typically designed with a differential amplifier for the input stage. The balance of the differential amplifier is dependent on component match. Processing variables prevent exact match from occuring. This mismatch appears as offset voltage and/or offset current. In some applications this offset voltage cannot be tolerated and must be adjusted or corrected. There are three basic prior art approaches, i.e., (1) offset adjustment by external potentiometer;
(2) automatic offset correction by additional circuitry;
(3) offset adjustment by laser trimming of thin film resistors.

The external potentiometer approach uses a potentiometer external to the IC package to effect offset adjust. This approach has the disadvantage of requiring an additional component large in comparison to the IC package, thereby requiring extra board space and expense. The "automatic correction circuit" approach requires extensive additional circuitry which increases the chip area and over all cost. The laser trimming approach requires capital equipment investment by the manufacture. Also, the laser trimming must be performed prior to packaging.

As an advancement over these prior art techniques, U.S. Pat. No. 3,761,787 to Davis et al., described a circuit for internally adjusting the offset voltage of a bipolar transistor operational amplifier using a two segment collector with one of the segments being connected to the collector conductor by fusible metal links. As illustrated in FIG. 2 of that patent, two probe pads 50 and 52 are interconnected by a fusible link 53 and connect the smaller collector 49 to the collector conductor 48. If trimming is necessary, a voltage is applied across the probe pads 50 and 52 to burn out the fusible link 53. This structure requires special probe contact pads and accessible prior to packaging.

Thus there exists a need for a circuit incorporating the principles of Davis et al. without the disadvantages.

SUMMARY OF THE INVENTION

The operational amplifier of the present invention includes two parallel transistors in each of the two current paths with one of the transistors being connected to the current path by a fusible element and the other transistor being connected to the path by an impedance, which does not affect the overall operation of the current path during normal operation with the current in the first direction and steers the current in the opposite direction towards the fusible element to cause the fusible element to blow. The fusing current is produced by forward biasing a normally reversed biased p-n junction of the transistor external to the amplifier package.

If the two transistors are bipolar transistors, the impedance and the fusible element are connected to the collectors and the bases are tied together. A single bipolar transistor with plural collectors could be used. The base-collector junction is forward biased to blow the fusible element. The impedance may be a resistance or a diode reversed biased during current steering. The two transistors may be a junction field effect transistor with the impedance and fusible element being connected to two drain segments. The gate-drain junction is forward biased to blow the fusible element. By using three parallel transistors or three drain segments, and the two fusible elements, multiple adjustment is capable. The two fusible elements could have different current capacities or one of the fusible elements could include a series impedance to initially steer blowing current toward the other fusible element.

OBJECTS OF THE INVENTION

An object of the present invention is to provide an operational amplifier having an adjustable offset voltage capability wherein the adjustment is accomplished by applying voltages to external leads.

A further object of the invention is to provide an operational amplifier with offset voltage adjustment capability requiring no special steps of manufacture or additional chip area.

Still another object of the invention is to provide an operational amplifier wherein the offset voltage may be adjusted after packaging.

An even further object is to provide an amplifier whose offset voltage is adjusted by forward biasing a normally reversed p-n junction.

Other objects, advantages and novel features of the present invention will become apparant from the following detailed description of the invention when considered in conjunction with the accompanying drawings.

BRIEF DESCRIPTION OF THE DRAWINGS

FIG. 3 is a topological view of a field effect transistor incorporating the principles of the present invention and including a diode as the steering impedance.

DESCRIPTION OF THE PREFERRED EMBODIMENTS

Figure 1:
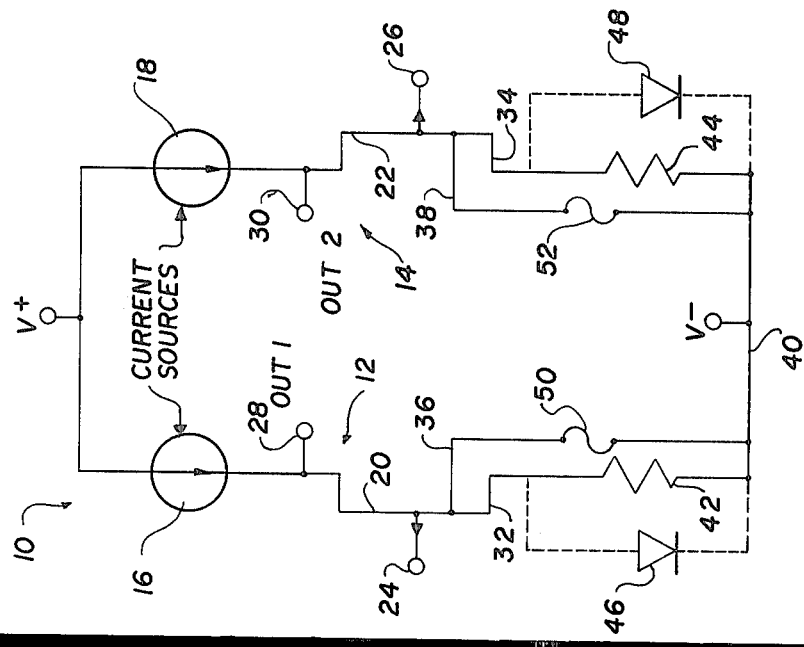
FIG. 1 is a schematic of a field effect transistor differential amplifier input stage for an operational amplifier incorporating the principles of the present invention.

FIG. 1, which illustrates the differential amplifier 10 for the input stage of an operational amplifier, includes two current paths 12 and 14 connected between the positive and negative terminals V+ and V−. Each current path includes a current source 16, 18 and a field effect transistor 20, 22 having its source-drain path connected in series with the current source. The differential amplifier 10 includes inputs 24 and 26 at the gates of field effect transistors 20 and 22 and outputs 28 and 30 at the source of the field effect transistors 20 and 22. Each of the field effect transistors 20 and 22 include a first drain segment 32 and 34 and a second drain segment 36 and 38, respectively. The first drain segments 32 and 34 are connected to a common drain conductor 40 by a steering impedance which is illustrated as a resistance 42 and 44 or alternatively as diodes 46 and 48 illustrated in phantom. The second drain segment 36 and 38 are connected to the common drain conductor 40 by fusible links 50 and 52.

The present invention by using segment drain portion 32, 34, 36, 38 provides the ability to adjust the voltage and current characteristics of a field effect transistor and consequently the offset voltage of the differential amplifier. When operated in the saturated region, the input voltage of the FET is related to its current, by the expression:

$$V_{gs} = -\left(\frac{I_d}{\frac{W}{L}K'}\right)^{\frac{1}{2}} + V_p$$

where $I_d$=drain current; $V_{gs}$=the input (gate to source) voltage; W/L=channel width to channel length ratio, $K'$ is a constant which is independent of device topography; $V_p$=pinch off voltage of the device. For a device with several drain regions, the W/L of the entire device equals the sum of the W/L's of each of its drain regions (if they are parallel conductive paths).

The offset voltage of a pair of FET's is the difference in their input voltages when operating at equal currents:

$$V_{off} = V_{gs1} - V_{gs2} =$$
$$-\left(\frac{I_d}{\frac{W_1}{L_1}K_1'}\right)^{\frac{1}{2}} + V_{p1} + \left(\frac{I_d}{\frac{W_2}{L_2}K_2'}\right)^{\frac{1}{2}} - V_{p2}$$

In the present invention, the offset voltage is adjusted by disconnecting one or more of the drain segments of the device with the smaller $V_{gs}$. This increases its $V_{gs}$ by decreasing the W/L of the device. The W/L decrease occurs because no current can flow through the disconnected drain regions, therefore their W/L's are not included in the sum for the entire device.

After fabrication of an operational amplifier including the circuit of FIG. 1, electrical tests are performed to indicate the voltage offset of the two current paths 12 and 14. Depending upon results of the test, one current path must be trimmed. The gate of the current path to be trimmed is brought to a voltage negative with respect to the drain voltage V−. The voltage drop is increased until the fusible link blows, disconnecting the desired drain segment either 36 or 38 from the common drain connection 40. The steering impedance, either the resistance 42, 44 or the diode 46, 48 in series with the first drain segment 32, 34 of the to be trimmed FET, steers the current to the fuse preventing any damage to the first drain segment 32, 34. If a resistance is used, the difference of the resistance path is sufficient to steer the current through the preferred fuse path. The diodes 46 and 48 are reversed bias and thus, no current will pass therethrough nor through the first drain segment 32, 34. The test may be performed on the device before being applied to the package, or may be performed after packing since the input terminals 24 and 26 are an available external package as are the voltage supply terminals.

The field effect transistors 20 and 22 are preferrably junction field effect transistors. A steering resistance 42, 44 of approximately 2,500 ohms or steering diode 46 and 48 having a forward voltage drop of 0.7 volts could be used which would not seriously detract from the normal operation of the differential amplifier 10 The fuse links 50 and 52 could be formed from nichrome, for example, and have current capacity of 30 milliamps before blowing. Thus, for a negative supply voltage of zero volts, the voltage applied to the gate 24, 26 would be −6 volts which would create a sufficient voltage to blow the fuse of the example. The value of the fusing current and the steering device will depend on the fuse characteristics.

Figure 2:
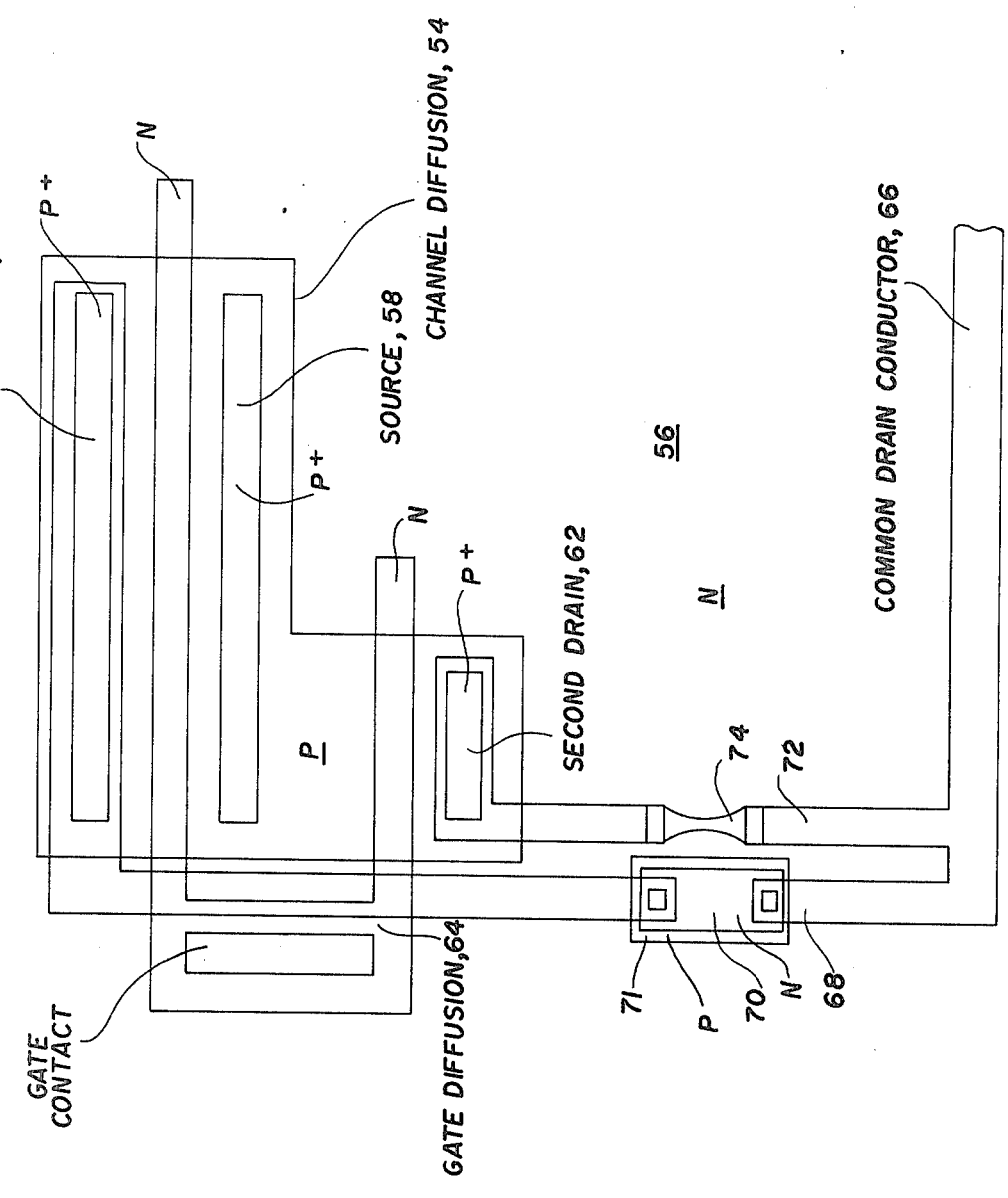
FIG. 2 is a topological view of the field effect transistor incorporating the principles of the present invention and including a resistance as the steering impedance.

An integrated circuit implementation of a field effect transistor used in FIG. 1 is illustrated in FIG. 2. The diffused P− type channel region 54 is formed in an N− type substrate 56. A P+ source contact region 58 is formed in the channel region 54 with opposed first P+ drain segment 60 and second P+ drain segment 62. Although the source contact 58 is shown between the drain segments 60 and 62, the drain segment may be on the same side of the drain contact 58 as long as they are separated from each other. As will be noted, the diffused channel region 54 defines the geometry of the drain segments. The N type gate region 64 is diffused in the channel region having a first portion separating the first drain segment 60 from the source region 58 and a second portion separating the second drain segment 62 from the source region 58.

The first drain segment 60, is connected to a common drain lead 66 by conductor 68 and a diffused N type resistor 70 in a P isolated region 71 of the substrate 56. The second drain segment 62 is connected to the common drain lead 66 by conductor 72 and a fusible element 74. The device can be readily formed in a silicon substrate having aluminum conductors and a nichrome fuse. These are only suggestions of types of materials which may be used. It should also be noted that although the device has been described as a P channel junction field effect transistor, it is obvious that is may be implemented as an N channel junction field effect transistor. The biasing and the diodes of the circuit of FIG. 1 would be appropriately changed to accomodate the N channel junction field effect transistors.

If more than one level of offset is desired, the drain may be formed with three or more segments as illustrated FIG. 3. In addition to the first drain segment 60 and the second drain segment 62, a third P+ drain segment 76 is provided in the diffused channel region 54 opposite source region 58. Diffused gate 62 is extended to separate the source region 58 from the third drain segment 76. The third drain segment 76 is connected to the common drain conductor 66 by conductor 78 and fusible element 80 whose current capacity is greater than that for fusible element 74 such that the fusible element 74 is the first blown. Increasing the voltage current increases the current and subsequently blows fusible element 80.

The field effect transistor of FIG. 3 illustrates the integrated circuit construction of a diode instead of the resistor 70 illustrated in FIG. 2. An N type region or cathode 82 is diffused into a P type region 84 in the N substrate 56. The anode is a P+ type region 86 diffused into the N type region 82.

It should be noted that the source and gate conductors have been deleted for sake of clarity. It should also be noted that the conductors 66, 68, 72, and 78 are separated from the substrate 56 and the diffused regions therein by a layer of insulation making contacts with the appropriate diffused regions therethrough where required.

The field effect transistors of FIGS. 2 and 3 could be fabricated wherein the source and drains are separated by 25 microns to define the channel length L. The first drain segment 60 has a length of 1,000 microns and the third drain segment 76 has a length of 12 microns to define separate channel widths W. The FET of FIG. 2 will change its characteristics by 10 millivolts by blowing fusible element 74. The FET of FIG. 3 will change its characteristics by 10 millivolts by blowing fusible element 74 and an addition 5 millivolts by blowing fusible element 80. This will produce the range of adjustment of voltage offset normally needed.

Figure 4:
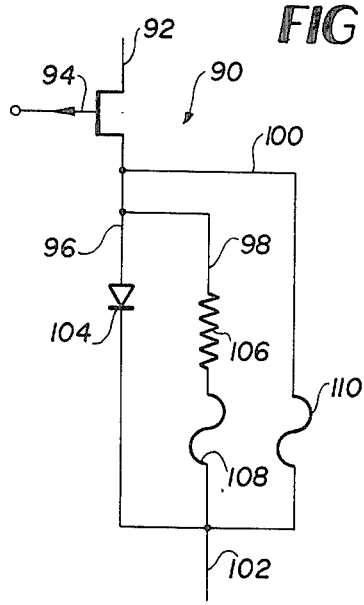
FIG. 4 is a schematic of a junction field effect transistor incorporating the principles of the present invention and including a resistance and a diode as steering impedances and two fuses.

Another embodiment of multiple level adjust using a three segment drain is illustrated in FIG. 4. The junction field effect transistor 90 includes a source 92, gate 94 and three drain segments 96, 98 and 100. The first drain segment 96 is connected to a common drain connector 102 by a diode 104. The second drain segment 98 is connected to common drain connector 102 by a resistance 106 and fusible element 108. The third drain segment 100 is connected to common drain connector 102 by fusible element 110. Diode 104 steers fusing current to the two fusible elements 108 and 110. The resistance 106 steers most of the fusing current to fusible element 110 and limits the current to fusible element 108 below the fusing current for fusible element 108 for the applied voltage sufficient to blow fusible element 110. Increasing the applied voltage produces a fusing current sufficient to blow fusible element 108.

Figure 5:
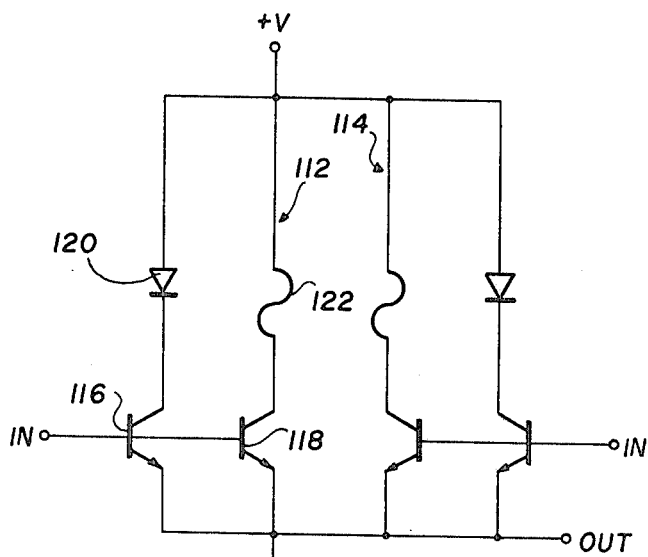
FIGS. 5 and 6 are schematics of a bipolar transistor differential amplifier incorporating the principles of the present invention.
Figure 6:
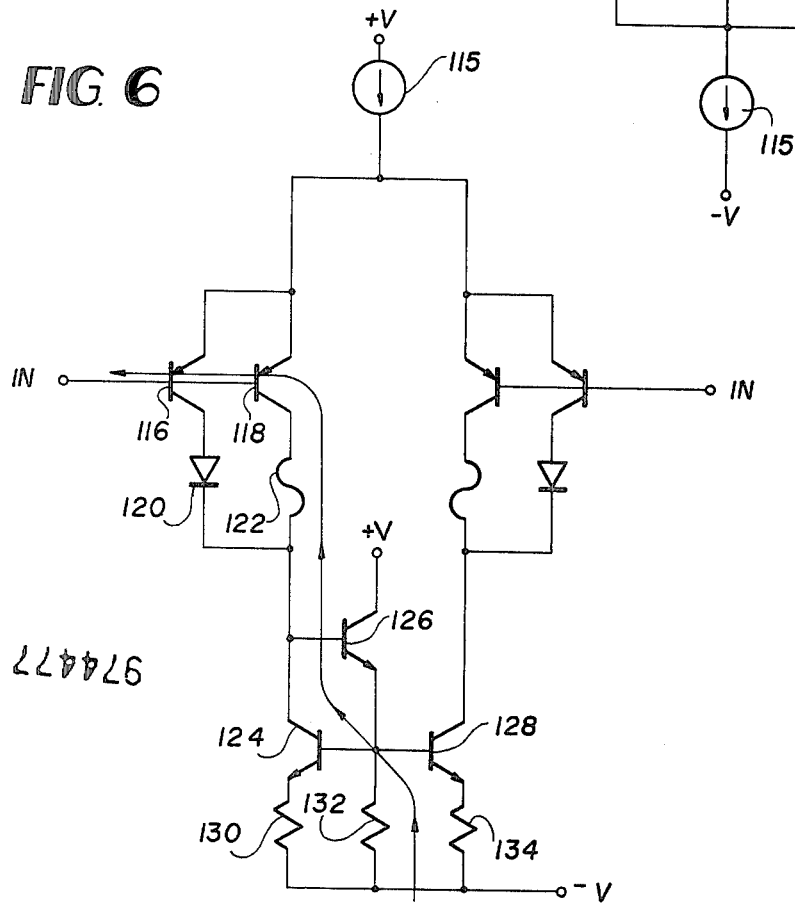

The principles of the present invention are applicable to bipolar transistors as illustrated in FIGS. 5 and 6. Two current paths 112 and 114 are connected in parallel between V+ and current sink 115. Each path includes two parallelly connected transistors 116 and 118 having a steering impedance 120, illustrate as a diode and a fusible element 122 connected to their collectors respectively. Their bases are tied together and the emitters are connected to the current sink 115. In normal operation, the base-collector junction is reversed. To adjust the offset of the amplifier, a voltage is applied to the bases to forward bias the base-collector junction. The resulting current is steered by diode 120 to flow only through fusible element 122 to blow the same.

In FIG. 6, the two current paths 112 and 114 each include two parallel transistors 116 and 118 and diode 120 and fusible element 122 connected to their collectors. Transistors 116 and 118 are NPN in FIG. 5 and PNP in FIG. 6. The current paths are connected to B+ by a current source 116 and to V− by transistors 124, 126, 128 and resistors 130, 132 and 134. The path of the fusing current when the base-collector junctions are forward biased is illustrated in FIG. 6 by the arrows.

Although a pair of bipolar transistors 116 and 118 are illustrated in FIGS. 5 and 6, a single bipolar having a pair of collector segments could be used. One of the collector segments having a fusible element connected thereto and the other having a current steering impedance connected thereto.

From the preceding description of the preferred embodiments, it is evident that the objects of the invention are attained in that an amplifier having a transistor structure which is capable of adjusting its electrical characteristics using common external leads is provided. Although the invention has been described and illustrated in detail, it is to be clearly understood that the same is by way of illustration and example only, is not to be taken by way of limitation. The spirit and scope of this invention being limited only by the terms of the appended claims.

What is claimed:

1. In an amplifier including first and second separate current paths having a predetermined differential voltage offset therebetween in the absence of any input signals to said amplifier an in each of said current paths a field effect transistor having a source, drain and gate electrodes, the improvement being said field effect transistors each comprising:

a first and second separate drain segments with a common electrode;

fusible conductive means interconnecting said second drain segment and said common electrode; and impedance means interconnecting said first drain segment and said common electrode for steering the current to said fusible conductive means produced when a voltage is applied across the gate and drain segments to blow said fusible conductive means and alter said voltage offset.

2. The amplifier according to claim 1, wherein said impedance means include a diode connected to be forward biased during normal operation of said field effect transistors and reversed biased during the blowing of said fusible conductive means.

3. The amplifier according to claim 1 wherein said field effect transistors are junction type having a single source and a pair of gates with a common electrode, one between said source and a respective drain segment.

4. The amplifier according to claim 1 wherein said field effect transistors each include a third separate drain segment, a fusible conductive means interconnecting said third drain segment and said common electrode, the fusible conducting means have different current capacities.

5. The amplifier according to claim 1 wherein said field effect transistors each include a third separate drain segment, a second fusible conductive means and a second impedance means interconnecting said third drain segment and said common electrode, said second impedance means for steering the blowing current through the fusible conductive means of said second drain segment, and said impedance means of said first drain segment steering the blowing current through both fusible conductive means.

6. A field effect transistor with adjustable voltage characteristics comprising:

a substrate of a first conductivity type;

a channel region of a second conductivity type in said channel region a first and second separated drain regions of said second conductivity in said channel region opposite said source region;

a gate region of said first conductivity type in said channel region between said source region and said first and second drain regions;

a drain conductor;

a fusible means connecting said second drain region to said drain conductor; and an impedance means connecting said first drain region to said drain conductor for steering current to said fusible means when a sufficient voltage is applied to across said gate region and said drain conductor to forward bias said gate and drain regions to conduct a current sufficient to blow said fusible means.

7. The field effect transistor according to claim 6 wherein said impedance means includes a diode connected to be forward biased during operation of said field effect transistor and reversed bias during blowing of said fusible means.

8. The field effect transistor according to claim 6 including:
a third drain region of said second conductivity type in said channel region opposite said source region;
a third gate region of said first conductivity type in said channel between said source region and said third drain region; and
a second fusible means and a second impedance means interconnecting said drain conductor and said third drain region for further adjusting the voltage characteristics of said field effect transistor when a sufficient voltage is applied to said first and second conductors to forward bias said gate and drain regions to blow first said fusible means and second said fusible means.

9. The field effect transistor according to claim 6 wherein said source region is between said first and second drain regions and said second drain region is smaller than said first drain region.

10. A method of adjusting the voltage offset between two conductive paths of an amplifier wherein each path includes a field effect transistor having a source, a gate and first and second drain segments, a fusible element in series with said second drain segment comprising:
measuring the voltage offset between said first and second current paths; and
applying a sufficient voltage across said gate, second drain and fusible element of one of said field effect transistors sufficient to blow said fusible element thereby altering said offset voltage.

11. A method of adjusting the voltage characteristics of a field effect transistor comprising:
forming the drain of said field effect transistor with at least a first and second separated drain segments;
connecting said second drain segment to a drain connector by a fusible element;
connecting said first drain segment to said drain conductor by an impedance capable of steering current to said fusible element during the next step; and
applying a voltage across said gate and said drain conductor sufficient to create a current sufficient to blow said fusible element thereby disconnecting said second drain segment from said drain conductor and altering the voltage characteristics of said field effect transistor.

12. The method of claim 11 including:
forming said drain with a third drain segment;
connecting said third drain segment to said drain conductor with a fusible element and an impedance capable of steering fusing current to the fusible element of said second drain segment until it blows and to receive fusing current subsequently; and
applying a voltage across said gate and said drain conductor sufficient to create a current to blow the fusible element of the third drain segment.

13. The method of claim 11 including:
forming said drain with a third drain segment;
connecting said third drain segment to said drain conductor with a fusible element having a higher current capacity than the fusible element connected to said second drain segment; and
applying a voltage across said gate and said drain conductor sufficient to create a current sufficient to blow the fusible element connected to said third drain segment.

14. A method of adjusting the voltage characteristics of a field effect transistor comprising;
forming the drain of said field effect transistor with at least a first and second separated segments;
connecting said second drain segment to a drain conductor by a fusible element; and
applying a voltage across said gate, second drain segment and said fusible element sufficient to create a current sufficient to blow said fusible element thereby disconnecting said second drain segment from said drain conductor and altering the voltage characteristics of said field effect transistor.

15. In an amplifier including first and second separate current paths having a predetermined differential voltage offset therebetween in the absence of any input signals to said operational amplifier, the improvement in each current path comprising:
a first transistor having a base, collector and emitter;
a second transistor having a base, collector and emitter;
said bases being connected together;
said emitter-collector path of said first and second transistors being connected in parallel to each other in said current paths;
fusible means interconnecting said second transistor's emittercollector path and said current path; and
impedance means interconnecting said first transistor's emittercollector path and said current path for steering the current to said fusible means produced when a voltage is applied across the base, said fusible means and said impedance means to blow said fusible means and alter said voltage offset.

16. The amplifier according to claim 15 wherein said impedance means include a diode connected to be forward biased during normal operation of said transistors and reversed biased during the blowing of said fusible means.

17. The amplifier according to claim 15 wherein said fusible means and said impedance means are connected to said collectors and the base-collector junctions are forward biased during fusing.

18. A method of adjusting the voltage offset between two current paths of an amplifier wherein each path includes two transistors having their emitter-collector paths connected in parallel and base connected together, a fusible element in series with one of the emitter-collector paths and an impedance in the other emitter-collector path comprising:
measuring the voltage offset between said first and second current paths; and
applying a sufficient voltage across said bases, said collectors and fusible element of one of said current paths sufficient to forward bias the base to collector junctions and produce a current to blow said fusible element thereby altering said offset voltage.

19. A method of adjusting the voltage offset between two current paths of an amplifier comprising:
connecting the emitter-collector paths of two transistors in parallel in each of said current paths;
connecting a fusible element to the collector of one of said transistors in each of said paths;
connecting to the collector of the other transistor in each of said paths an impedance capable of steering current to said fusible element during the next step; and applying a voltage across the bases, collectors, fusible element and impedance of one of said current paths to forward bias said base to collector junctions and create a current sufficient to blow said fusible element thereby disconnecting said one transistor from said current path and altering the offset voltage.

20. In an amplifier including first and second separate current paths having a predetermined differential voltage offset therebetween in the absence of any input signals to said amplifier and in each of said current paths, an input transistor means having a conduction path and a control electrode, the improvement being said input transistor means each comprising:

two transistors having their conduction paths connected in parallel in a respective current path and their control electrode tied together as an input;

a fusible conductive means interconnecting one end of the conduction path of one of the transistors to said current path; and impedance means interconnecting a corresponding end of the conduction path of the other transistor to said current path for steering the current to said fusible conductive means produced when a voltage is applied across said control electrodes and said one end of the conduction path to forward bias a p-n junction of said transistors which is reversed biased in the normal operation of the transistor to blow said fusible conductive means and alter said voltage offset.

21. The amplifier according to claim 20 wherein said impedance means include a diode connected to be forward biased during normal operation of said transistors and reversed biased during the blowing of said fusible conductive means.

22. The amplifier according to claim 20 wherein said transistors are bipolar transistors, said p-n junction is the base-collector junction, and said base is said control electrode.

23. The amplifier according to claim 20 wherein said two transistors have a common emitter and base and separate collectors, said p-n junction is the base-collector junction, and said base is said control electrode.

24. The amplifier according to claim 20 wherein said transistors are junction field effect transistors, said p-n junction is the gate-drain junction and said gate is said control electrode.

25. The amplifier according to claim 20 wherein said two transistors are junction field effect transistors having a common source, a pair of drains and a common gate between said common source and said pair of drains, said p-n junction is the gate-drains junction and said gate is said control electrode.

* * * * *